US008068211B2

(12) United States Patent
Kosugi

(10) Patent No.: US 8,068,211 B2
(45) Date of Patent: Nov. 29, 2011

(54) EXPOSURE APPARATUS AND METHOD FOR MANUFACTURING DEVICE

(75) Inventor: Yuji Kosugi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 576 days.

(21) Appl. No.: 12/166,978

(22) Filed: Jul. 2, 2008

(65) Prior Publication Data

US 2009/0009739 A1  Jan. 8, 2009

(30) Foreign Application Priority Data

Jul. 6, 2007  (JP) .................................. 2007-178567

(51) Int. Cl.
*G03B 27/42* (2006.01)
*G03B 27/52* (2006.01)

(52) U.S. Cl. ........................................... 355/53; 355/55

(58) Field of Classification Search .................... 355/52, 355/53, 55, 67–71; 356/399–401
See application file for complete search history.

(56) References Cited

U.S. PATENT DOCUMENTS

| | | | |
|---|---|---|---|
| 6,081,614 A * | 6/2000 | Yamada et al. | 382/151 |
| 7,583,356 B2 * | 9/2009 | Tsutsumi et al. | 355/52 |
| 2008/0036990 A1 * | 2/2008 | Hirai et al. | 355/68 |
| 2008/0062395 A1 * | 3/2008 | Yoshimura | 355/55 |
| 2009/0042115 A1 * | 2/2009 | Inoue et al. | 430/22 |
| 2010/0002218 A1 * | 1/2010 | Kosugi | 355/67 |

FOREIGN PATENT DOCUMENTS

JP  09-045608 A  2/1997

* cited by examiner

*Primary Examiner* — Hung Henry Nguyen

(57) ABSTRACT

An exposure apparatus for exposing a shot region on a substrate includes a movable stage, a projection optical system, a measuring device configured to measure a position of a partial region of a surface of the substrate, and a controller configured to cause the measuring device to measure the position with respect to each of a plurality of measurement points of each of a plurality of shot regions, to determine a global shape of the surface based on the measured positions, to calculate a correction value with respect to each of the plurality of measurement points based on the determined global shape, and to move the stage based on measurement values corrected using the respective correction values corresponding to the respective measurement points.

5 Claims, 12 Drawing Sheets

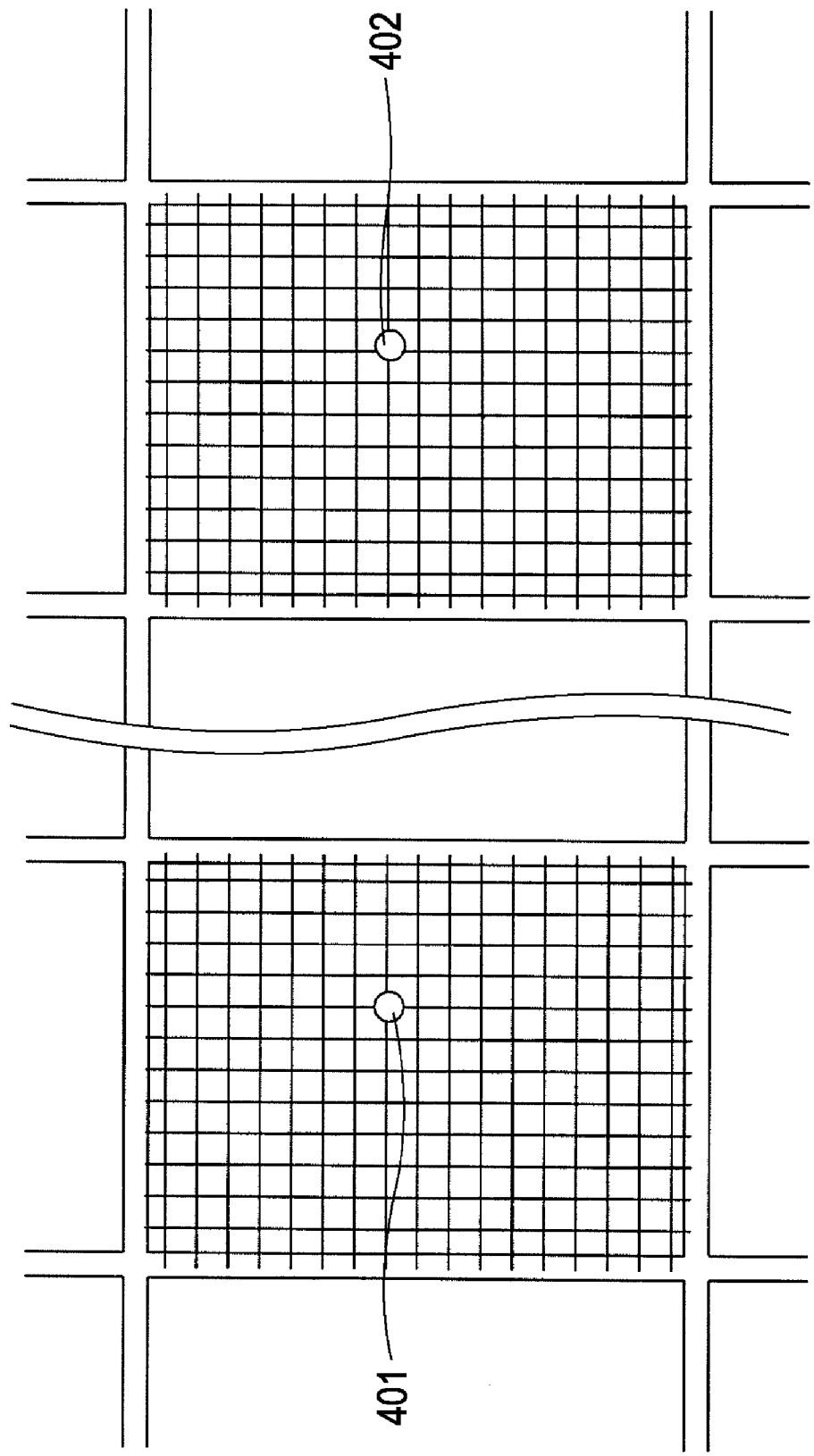

SCANNING DIRECTION

NONSCANNING
DIRECTION

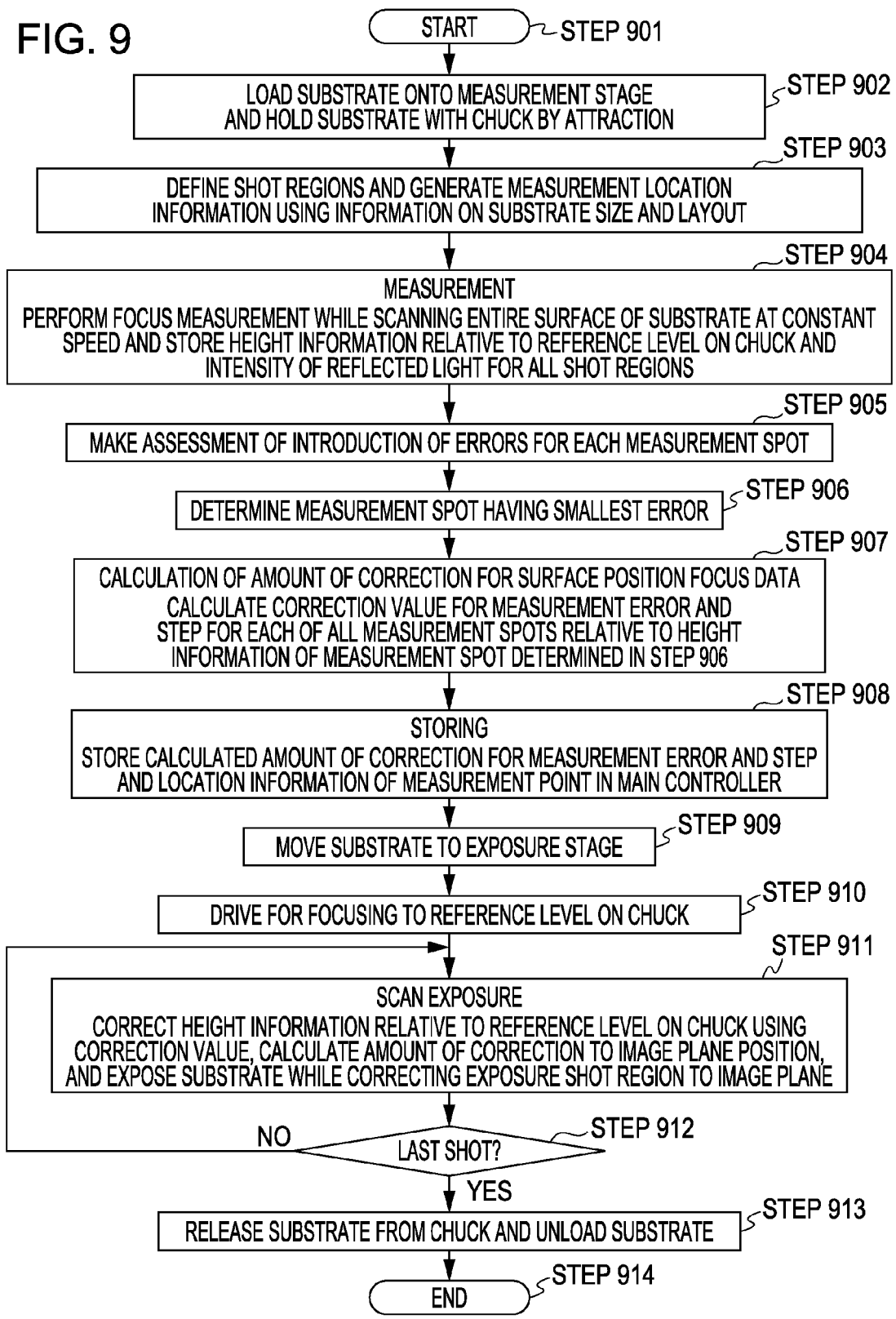

FIG. 11
PRIOR ART
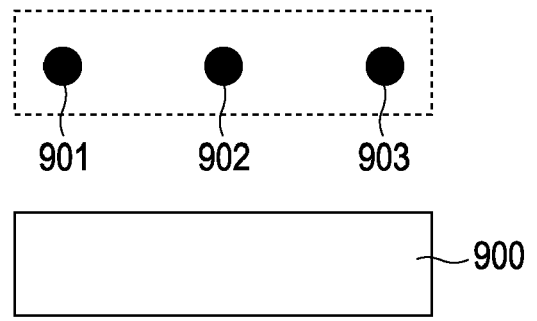
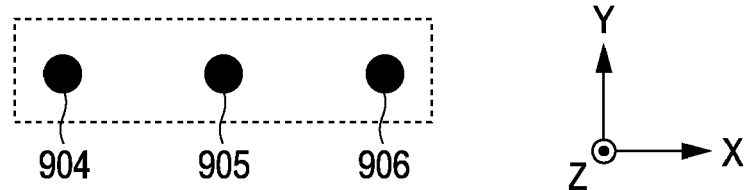
FIG. 12
PRIOR ART
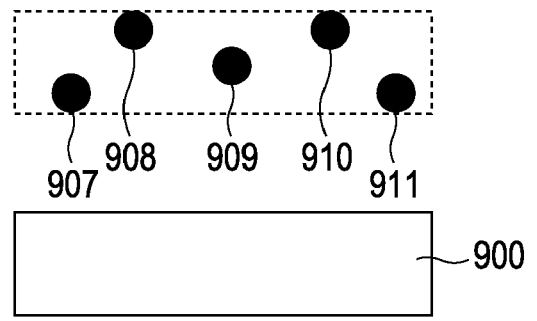
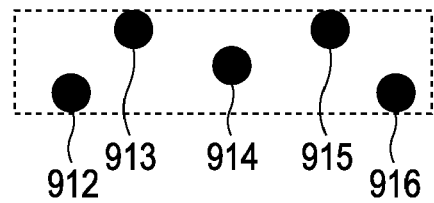

EXPOSURE APPARATUS AND METHOD FOR MANUFACTURING DEVICE

BACKGROUND OF THE INVENTION

1. Field of the Invention

The present invention relates to an exposure apparatus for use in the manufacture of devices, such as semiconductor devices, and to a method for manufacturing a device.

2. Description of the Related Art

In general, an exposure apparatus that forms the image of a pattern on a mask or reticle (hereinafter referred to collectively as a "reticle") on a photosensitive substrate via a projection optical system is used in a lithographic process of the manufacture of semiconductor devices, a liquid crystal display device, a thin-film magnetic, or other devices. With the advance of finer pattern rules and higher packaging densities of an integrated circuit, it is desired for an exposure apparatus that the image of a circuit pattern on a reticle be projected onto the surface of a substrate with higher resolution to expose the surface. The resolution in projecting the image of a circuit pattern depends on the numerical aperture (NA) of a projection optical system and wavelength of exposure light. Typically, a method of increasing the NA of the projection optical system using a constant wavelength of exposure light is performed. The wavelength of exposure light is being reduced more and more. For example, the wavelength of exposure light is shifting from the g-line to the i-line to the oscillation frequency of an excimer laser. For the excimer laser oscillation frequency, the wavelength of exposure light is being reduced from 248 nm to 193 nm, and further to 157 nm. Moreover, the size of an exposure area is increasingly becoming larger.

One example of means for accomplishing these requirements is a stepper that projects light onto a substantially square exposure region of the surface of a substrate so as to form a reduced pattern image thereon and exposes the surface by the step-and-repeat process. Another example of such means is a scanning exposure apparatus that exposes a larger area of a substrate accurately by relatively scanning a reticle and the substrate with high speed using an exposure region that has a rectangular or arc slit shape, a so-called scanner. Such a scanner adjusts a surface shape of the substrate to an optimal exposure image-plane position for each scanning exposure slit, so the scanner has the advantage of reducing the influence resulting from the degree of flatness of the substrate. The scanner also can increase the size of the exposure region and the NA even with a lens equivalent to that used in a stepper. As a result, the scanner is becoming the dominating exposure apparatus. The scanner adjusts the surface of the substrate to an exposure image-plane position for each scanning exposure slit in real time. Thus, before the scanner reaches the exposure slit position, the position of the surface of the substrate is measured with a surface position measuring device and the driving is corrected. The oblique-incidence-light measurement technique is commonly used as the surface position measuring device. In the oblique-incidence-light measurement technique, a beam of light is made to be obliquely incident on the surface of the substrate, and a change in the position of a reflection point of light reflected from the surface of the substrate is measured as the amount of change in the position on a position sensor. The position of the reflection point on the surface of the substrate is referred to as a measurement spot. A plurality of measurement spots are present in the longitudinal direction of the exposure slit, i.e., a direction substantially perpendicular to the scanning direction to measure both the height and the inclination of the surface.

In FIG. 11, three measurement spots are present both in front and behind a scanning exposure slit 900, i.e., measurement spots 901, 902, and 903 and measurement spots 904, 905, and 906 are present in front and behind, respectively. In FIG. 12, five measurement spots are present both in front and behind the scanning exposure slit 900, i.e., measurement spots 907, 908, 909, 910, and 911 and measurement spots 912, 913, 914, 915, and 916 are present in front and behind, respectively. Having a focus measurement system both in front and behind enables scanning for exposure to be performed both from the front and rear directions in FIGS. 11 and 12, thus allowing focus measurement of the substrate to be performed before exposure. A twin-stage exposure apparatus, as illustrated in FIG. 1, has a focus measurement system that has many measurement spots 4a aligned in a line, as illustrated in FIG. 2, aside from an exposure system to find the surface of a substrate 4 in advance. It is necessary to reliably place an entire area to be exposed of the substrate 4 within the allowable depth of focus of a reduction projection optical system, the allowable depth of focus being reduced with an increase in NA. One example method for achieving this aim is disclosed in Japanese Patent Laid-Open No. 9-045608. In this method, the influence caused by local pattern steps (asperities) is eliminated or reduced, and a global shape of the surface is determined. For each measurement spot, the difference between a measurement value (height) and a corresponding value (height) obtained from the global shape the measurement value is determined as a correction value for the measurement value.

With recent expansion of networking technologies, the demand for high performance, such as high integration, reduction in a chip size, speed enhancement, and low power consumption, on a large-scale integration (LSI) is becoming increasingly great. To address the demand, as a result of advancement of finer design rules and multi-layering in conformance with the international technology roadmap for semiconductors (ITRS), a new problem also arises. With finer design rules, the previous process extension techniques could not facilitate speed enhancement of an LSI because they cause an increase in signal delay in an interconnection layer. The delay time in interconnections is proportional to the interconnect resistance and the capacitance between interconnections. Therefore, to advance achieving higher performance, it is necessary to reduce the interconnect resistance and the capacitance between interconnections. Resistance reduction by use of copper interconnections is becoming popular as one way of addressing the interconnect delay time problem. To reduce the capacitance between interconnections, it is necessary to reduce a dielectric constant of an interlayer dielectric. A typical method for reducing the dielectric constant is to introduce holes (the relative dielectric constant is one) to a heat-resistant material. This is called porosification. Copper interconnections are typically formed by a Damascene process because it is difficult to form copper interconnections by dry etching, which has been widely used in other interconnections. In the Damascene process, trenches for interconnections are formed on an interlayer dielectric in advance, and a copper coating is deposited thereon. Then, the copper other than that sunken within the trenches is removed by chemical-mechanical polishing (CMP) to form copper interconnections. In this process, if the mechanical strength of a porous interlayer dielectric is too low, the film is frequently peeled or destroyed inside the film by the stress in CMP. One measure to address this is a method of increasing the mechanical strength by embedding a dummy copper interconnect pattern in a porous interlayer insulating film. The dummy copper interconnect pattern is embedded such that the mechanical strength is uniform over the entire area of the surface of the substrate.

As previously described, the light measurement technique is commonly used as the surface position measuring device of the exposure apparatus. It has been found that the surface position measuring device using the light measurement technique has measuring errors in cases described below. When interference occurs between light reflected from the surface of the resist applied on the substrate and light reflected from the surface of the substrate after having passed through the resist, measuring errors arise. When there is a pattern formed on the surface of the substrate in a front-end process, if light reflected from the surface of the substrate has a distribution according to the distribution of reflectivity of the pattern caused by the influence of the pattern, measuring errors also occur. For either interference or reflectivity, the ratio of the intensity of light reflected from the pattern to the intensity of light reflected from the substrate is increased, thus resulting in a relative increase in the amount of measuring errors. This influence arises when a reflectivity distribution partially varies within a measurement spot region. In addition to a decrease in the depth of focus caused by finer design rules, an increase in the influence of interference caused by a reduction in the film thickness of a resist, and the use of interconnections having high reflectivity, such as copper interconnections, make influence of errors resulting from a reflectivity distribution within the surface of a substrate larger, compared with in the prior art.

An example of the influence of a reflectivity distribution on focus measuring will now be described with reference to FIGS. 5A and 5B and FIGS. 6A and 6B. FIGS. 5A and 5B are diagrams that illustrate the substrate 4 with a resist 503 applied thereon. A pattern 501 is formed in a front-end process and has a high reflectivity. The pattern 501 can be made of, for example, metal. A pattern 502 can be formed from, for example, an interlayer dielectric. The pattern 502 has a reflectivity lower than that in the pattern 501. A beam 504 having a constant beam diameter and uniform intensity distribution within the beam diameter is incident toward the substrate 4. The beam 504 is reflected from the surface of the resist 503, that of the pattern 501, or that of the pattern 502, thus forming reflected beams 505 or 506, each of which exhibits an intensity distribution varying within the beam diameter.

FIGS. 6A and 6B are graphs of intensity distributions in a state where the reflected beams 505 and 506, which are reflected from the surface of each of the resist 503, the pattern 501, and the pattern 502, are focused on a photo detector. In FIGS. 5A and 5B, the beam 504, which has a constant beam diameter and uniform intensity distribution within the beam diameter, is divided into two kinds of components described below. One is components 510 and 511 reflected from the surface of the resist 503. The other is components 512 and 513. The components 512 and 513 have passed through the resist 503, reflected from the surface of the pattern 501 or 502, and gone out of the resist 503 again. That is, each of the reflected beams 505 and 506 includes a combination of the component 510, which is reflected from the surface of the resist 503, and the component 512, which is reflected from the surface of the pattern 501, and a combination of the component 511, which is reflected from the surface of the resist 503, and the component 513, which is reflected from the surface of the pattern 502. Therefore, in FIGS. 5A and 5B, when the ground reflectivity of the pattern 501 is larger than that of the pattern 502, each of the reflected beams 505 and 506 exhibits an intensity distribution 602 varying within a beam diameter, as illustrated in FIGS. 6A and 6B. FIG. 5A corresponds to FIG. 6A, and FIG. 5B corresponds to FIG. 6B. The intensity distribution within the beam diameter of a reflected beam varies according to the position of a pattern arranged within the beam diameter of an incident beam. The surface position measuring device using the light measurement technique is set using a position detecting device (e.g., a charge-coupled device (CCD)) such that the position of a barycenter 601 of a reflected beam that exhibits an intensity distribution varying within the beam diameter is measured as the position of incidence of the reflected beam on the device. At this time, when the substrate lies in the same location, the position of the barycenter of a reflected beam does not vary in normal times. However, because the patterns 501 and 502 are present on the substrate, the barycenter 601 of the intensity distribution of the reflected beam varies depending on a relative positional relationship between the incident beam and the patterns 501 and 502, as illustrated in FIGS. 6A and 6B. Therefore, the measurement values have inherent detection errors according to the arrangement of the patterns 501 and 502. That is, detection errors inherent in a process where pattern structures are different occur. For the same reason, when the pattern 501 is a pattern that allows a beam to pass therethrough, for example, an interlayer dielectric, an interference state with the pattern 502 that does not allow a beam to pass therethrough is changed. Thus, even if they have the same ground reflectivity, the reflectivity is changed by the interference. Also in this case, where such a phenomenon occurs, the barycenter 601 of the intensity distribution of the reflected beam varies, as illustrated in FIGS. 6A and 6B.

SUMMARY OF THE INVENTION

The present invention provides a technique for reducing influence of errors resulting from reflectivity distribution of the surface of a substrate.

According to an aspect of the present invention, an exposure apparatus for exposing a shot region on a substrate, the exposure apparatus includes a stage, a projection optical system, a measuring device, and a controller. The stage is configured to hold the substrate and to be movable. The projection optical system is configured to project light onto the substrate. The measuring device is configured to measure a position of a partial region of a surface of the substrate with respect to a direction of an optical axis of the projection optical system. The controller is configured to cause the measuring device to measure the position with respect to each of a plurality of measurement points of each of a plurality of shot regions, to determine a global shape of the surface based on the measured positions, to calculate a correction value with respect to each of the plurality of measurement points based on the determined global shape, and to move the stage based on measurement values corrected using the respective correction values corresponding to the respective measurement points. The controller is configured to select a portion of the plurality of measurement points based on reproducibility of the measured positions corresponding to the respective measurement points, and to calculate the correction values such that a weight for the measured positions of the selected portion is greater than a weight for those of the other measurement points.

According to another aspect of the present invention, a method of manufacturing a device utilizing an exposure apparatus for exposing a shot region on a substrate is provided. The exposure apparatus includes a stage configured to hold the substrate and to be movable; a projection optical system configured to project light onto the substrate; a measuring device configured to measure a position of a partial region of a surface of the substrate with respect to a direction of an optical axis of the projection optical system; and a controller configured to cause the measuring device to measure the position with respect to each of a plurality of measurement points of each of a plurality of shot regions, to determine a global shape of the surface based on the measured positions, to calculate a correction value with respect to each of the plurality of measurement points based on the determined global shape, and to move the stage based on measurement values corrected using the respective correction values corresponding to the respective measurement points, wherein the controller is configured to select a portion of the plurality of measurement points based on reproducibility of the measured positions corresponding to the respective measurement points, and to calculate the correction values such that a weight for the measured positions of the selected portion is greater than a weight for those of the other measurement points. The method includes exposing a substrate to light using the exposure apparatus, developing the exposed substrate, and processing the developed substrate to manufacture the device.

The present invention can provide a technique for reducing influence of errors resulting from reflectivity distribution of the surface of a substrate.

Other advantages besides those discussed above shall be apparent to those skilled in the art from the description of a preferred embodiment of the invention which follows. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 illustrates an example of an arrangement of measurement spots within a shot region.

FIG. 9 is a flowchart of an example of a sequence that uses a surface position detecting method according to an embodiment of the present invention.

FIG. 11 illustrates an optical structure of a known focus measurement system that uses three points in an exposure slit.

FIG. 12 illustrates an optical structure of a known focus measurement system that uses five points in an exposure slit.

DESCRIPTION OF THE EMBODIMENTS

Various embodiments, features and aspects of the present invention will be described below with reference to the drawings.

First Exemplary Embodiment

Figure 1:
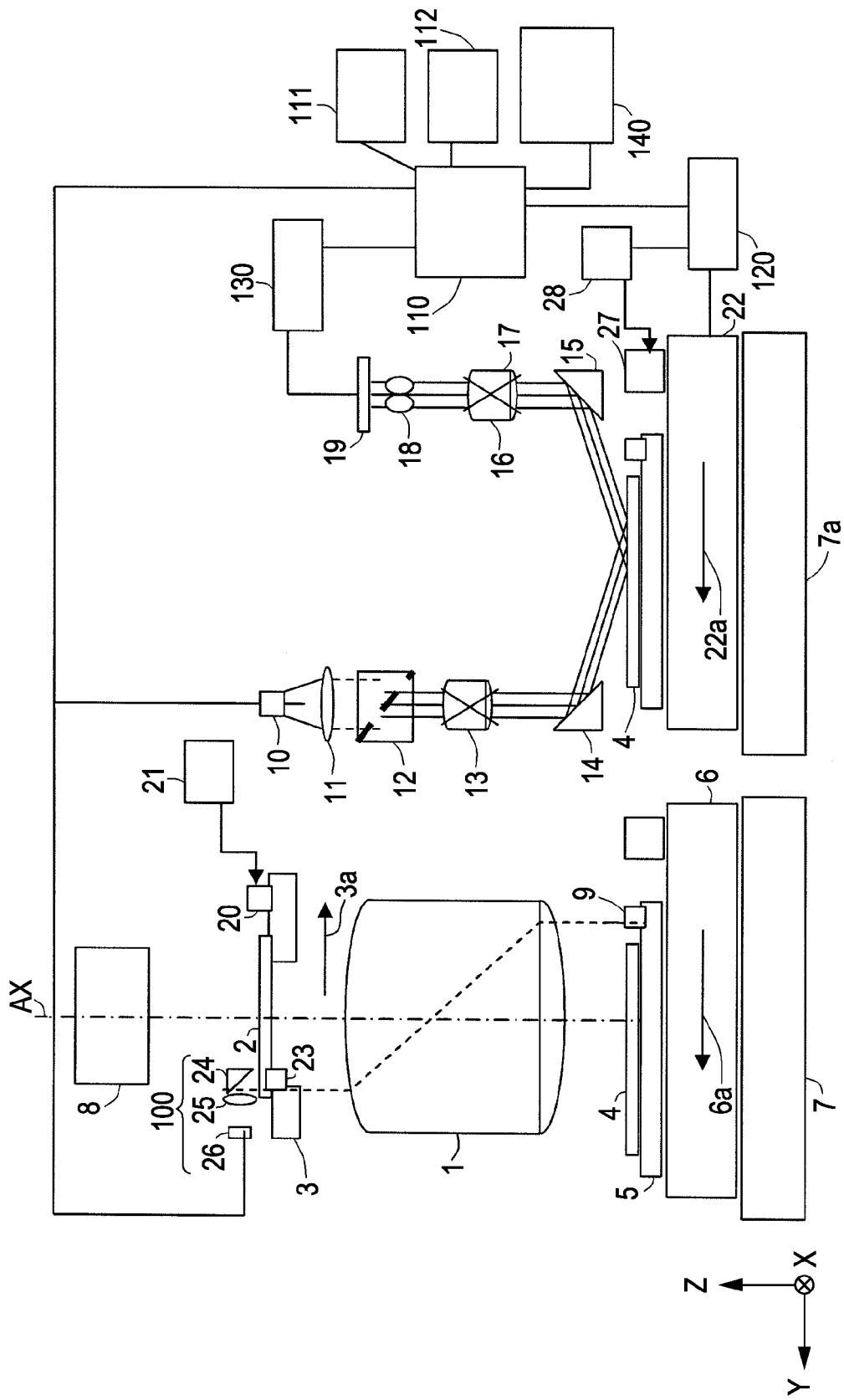
FIG. 1 is a partial schematic diagram that illustrates an example of a slit-scan projection exposure apparatus that uses a surface position detecting method according to an embodiment of the present invention.

A slit-scan projection exposure apparatus according to an embodiment of the present invention will be described below with reference to a partial schematic diagram illustrated in FIG. 1. In a reduction projection lens system 1, the optical axis thereof is indicated by AX, and the image plane thereof is perpendicular to a Z direction, as illustrated in FIG. 1. A reticle 2 is held on a reticle stage 3. The image of the pattern of the reticle 2 is projected by the reduction projection lens system 1 with a scaling factor of ¼, ½, or ⅕, thus forming an image on the image plane. A substrate 4 with a resist applied thereon includes many exposure regions (shot regions) having the same pattern structure formed in a previous exposure process. The substrate 4 is held with a substrate chuck 5, which is a holding jig, by attraction. The substrate chuck 5 is held on an exposure stage 6, which is a substrate stage. The exposure stage 6, which is a substrate stage, includes an XY stage horizontally movable in an x-axis direction and a y-axis direction indicated by the arrow 6a, a leveling stage movable in the z-axis direction, which is the direction of the optical axis AX of the reduction projection lens system 1, and rotatable about the x-axis and y-axis directions, and a rotational stage rotatable about the z-axis direction. The exposure stage 6, which is a substrate stage, constitutes a six-axis correction system for adjusting the image of the pattern of the reticle to the exposure region on the substrate 4. The exposure stage 6 is placed on a base 7.

A first height detecting unit (detector) illustrated in FIG. 1 is an optical measurement system for measuring the position of the surface and the inclination of the substrate 4. The first height detecting unit includes a light source 10, a collimating lens 11, a slit member 12, a bi-telecentric optical system 13, mirrors 14 and 15, a bi-telecentric receiving optical system 16, an aperture stop 17, an optical correction system group 18, and a photoelectric conversion unit group 19. The light source 10 includes an illuminating unit for emitting white light or light that has different peak wavelengths. The collimating lens 11 forms a parallel beam having a substantially uniform intensity distribution from a beam emitted from the light source 10. The slit member 12 has a prism shape and includes a pair of prisms in which their facing inclined surfaces are bonded together. The bonded surface has a plurality of openings (e.g., 25 pin holes). The openings are formed by use of a light shielding film made of, for example, chrome. The bi-telecentric optical system 13 introduces 25 individual beams passing through the pin holes of the slit member 12 into 25 measurement spots 4a, respectively, on the surface of the substrate 4 via the mirror 14. Although only one beam is illustrated in FIG. 1, 25 beams are present in a direction substantially perpendicular to the drawing. The plane on which the pin holes are formed to the bi-telecentric optical system 13 and the plane containing the surface of the substrate 4 are set such that the Scheimpflug condition is satisfied. In the present embodiment, an incident angle $\phi$ of each beam from the illuminating unit incident on the surface of the substrate 4 (an angle forming with a perpendicular line, i.e., the optical axis, from the surface of the substrate) is equal to or larger than 70°.

Figure 2:
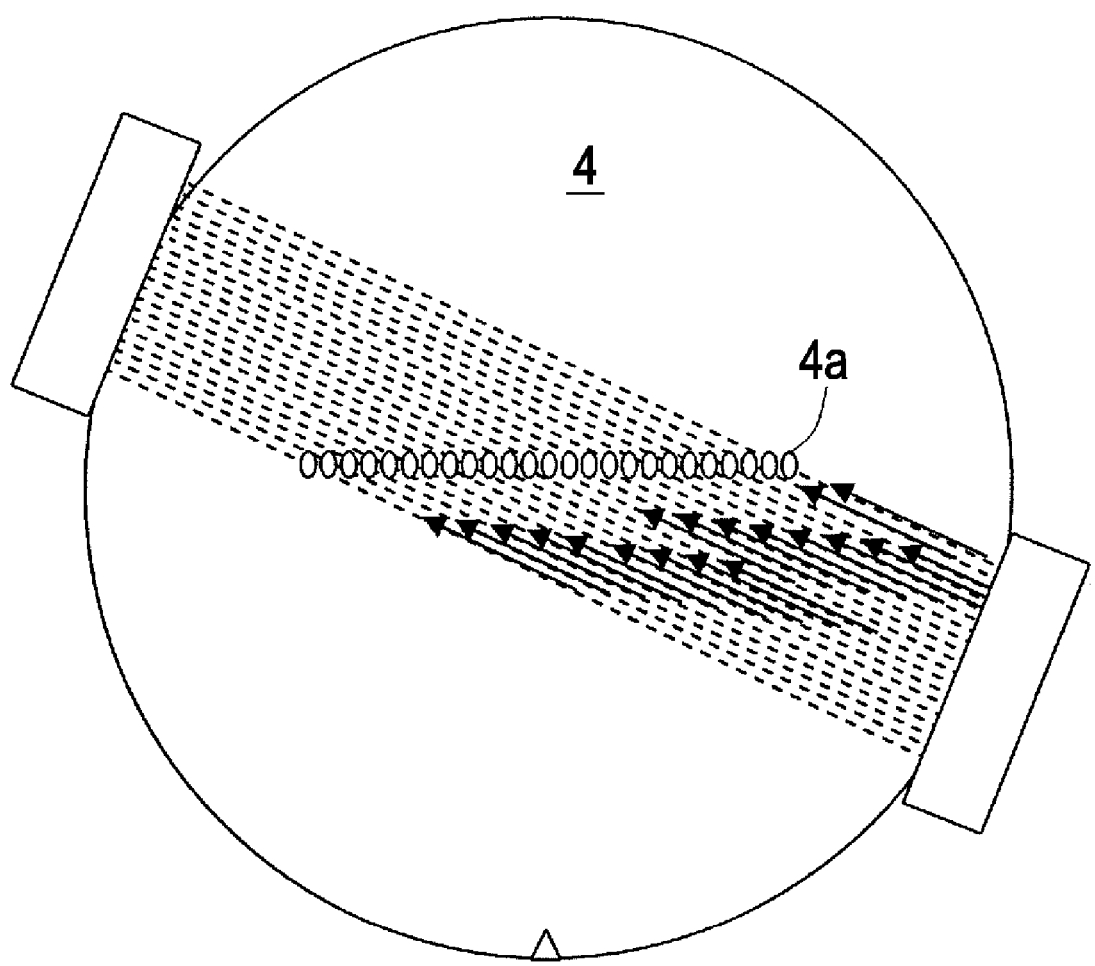
FIG. 2 illustrates a positional relationship between an exposure slit and each measurement spot in detection of the position of the surface performed by an optical detection system.
Figure 3:
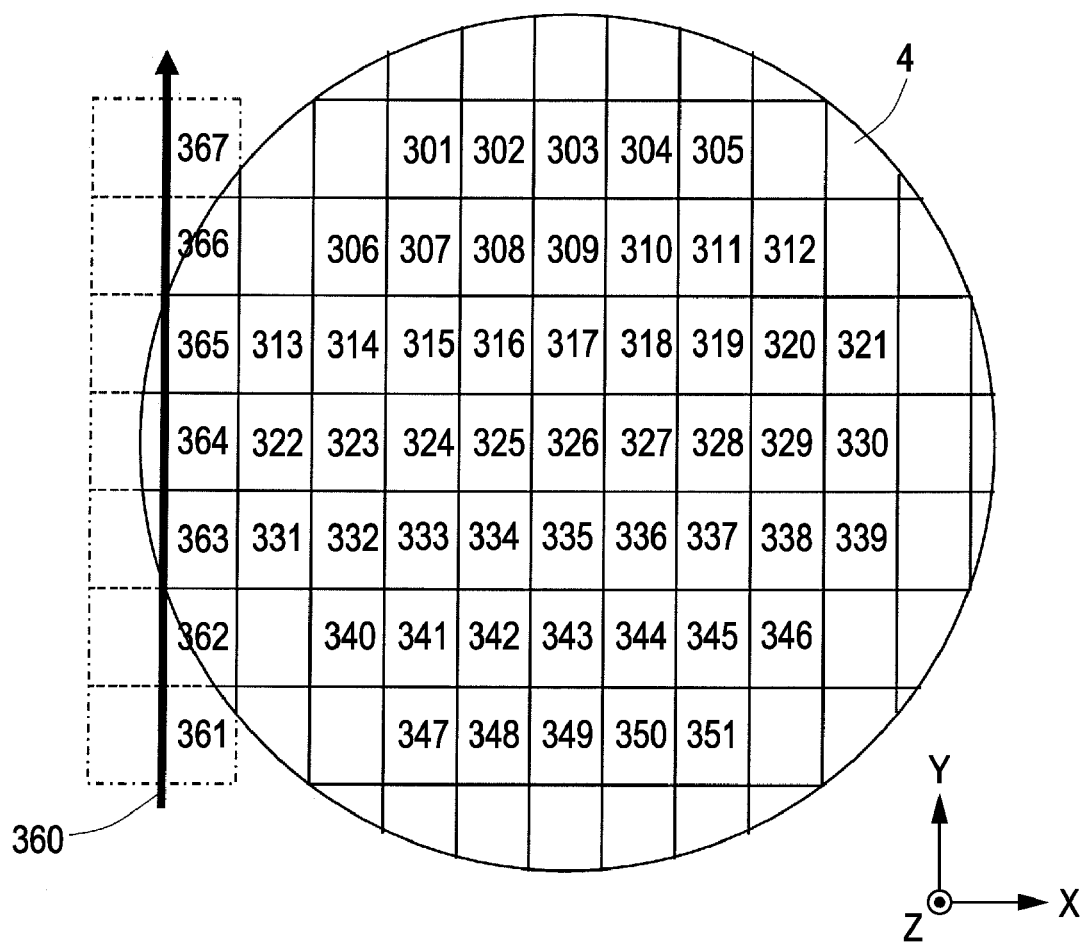
FIG. 3 illustrates an example of an arrangement of shot regions in an exposure region on the substrate.
Figure 5A:
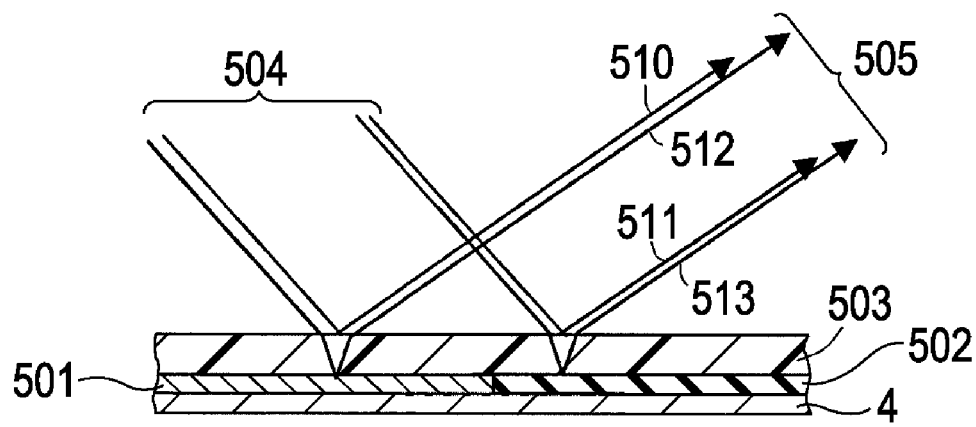
FIGS. 5A and 5B illustrate behaviors of beams reflected from different ground patterns.
Figure 5B:
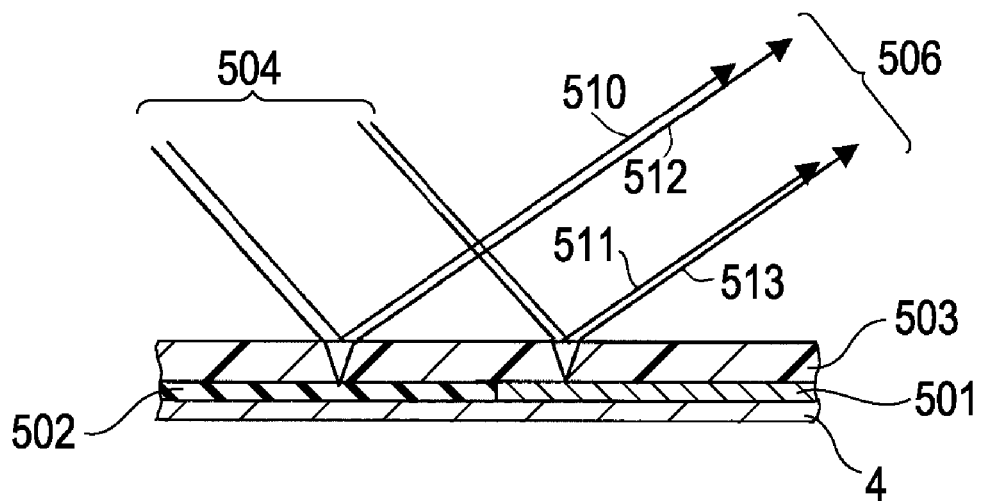
Figure 6A:
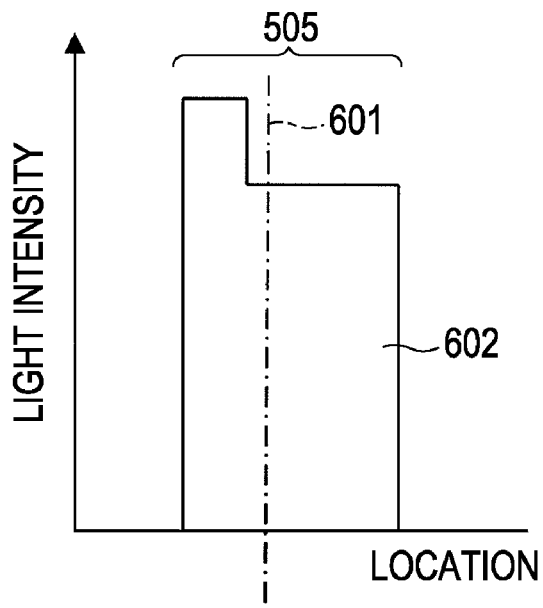
FIGS. 6A and 6B illustrate behaviors of the intensities of the reflected beams from different ground patterns.
Figure 6B:
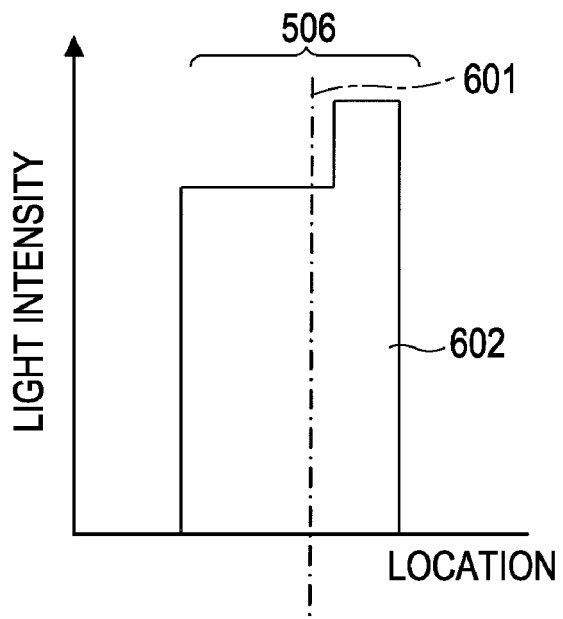

As illustrated in FIG. 3, a plurality of shot regions having the same pattern structure are arranged on the surface of the substrate 4. Twenty-five beams passing through the bi-telecentric optical system 13 are incident on the respective individual measurement spots 4a in a pattern region and focused thereon, as illustrated in FIG. 2. The twenty-five measurement spots 4a are arranged along the X direction across a length substantially the same as or more than the width in a nonscanning direction of an exposure slit on the exposure stage. Arranging the 25 measurement spots 4a across, for example, an area twice the width of the exposure slit on the exposure stage enables simultaneous measurement to at least two shot regions. Thus, the time required for measurement to all shot regions can be reduced. The beams are incident from the direction rotated from the x direction (the scanning direction 6a) within the xy-plane such that the 25 measurement spots 4a can be individually observed in the substrate 4. The bi-telecentric receiving optical system 16 receives 25 reflected beams from the surface of the substrate 4 via the mirror 15. The aperture stop 17 disposed in the bi-telecentric receiving optical system 16 is shared by the 25 measurement spots and cuts off a high-order diffracted light (noise light) caused by a circuit pattern present on the substrate 4. Beams passing through the bi-telecentric receiving optical system 16 are focused on a detection surface of the photoelectric conversion unit group 19 again so as to be spot beams having the same size by use of 25 individual correction lenses of the optical correction system group 18. The bi-telecentric receiving optical system 16, the aperture stop 17, and the optical correction system group 18 are components at a light receiving side and correct the tilt such a conjugate relationship is established between each of the measurement spots on the surface of the substrate 4 and the measurement surface of the photoelectric conversion unit group 19. As a result, there is no change in the position of a pin hole image on the measurement surface caused by a local inclination at each measurement spot, so the pin hole image is changed on the measurement surface in response to a change in height of each measurement spot in the optical direction AX. In the present embodiment, the photoelectric conversion unit group 19 is 25 one-dimensional CCD line sensors, for example. However, the photoelectric conversion unit group 19 can be one or more two-dimensional position measuring elements. In the present embodiment, the number of measurement spots is 25. However, it may be any number.

The reticle 2 is held on the reticle stage 3 by attraction. The reticle 2 is scanned with a constant speed in the direction indicated by the arrow 3a illustrated in FIG. 1 (y-axis direction) while being always maintained at a target coordinate position in a direction perpendicular to the direction indicated by the arrow 3a (x-axis direction). Position information on the reticle stage 3 in the X and Y directions is always measured by a reticle interference system 21 irradiating an XY bar mirror 20 fixed on the reticle stage 3 with a plurality of laser beams. An illumination optical system 8 can includes a light source for emitting pulsed light, such as an excimer laser, an optical beam shaping system (not shown), an optical integrator, a collimator, and a mirror. The optical beam shaping system shapes a cross-section (including a dimension) of an incident beam into a desired form. The optical integrator makes luminous intensity distribution of a beam uniform and illuminates the reticle 2 with a constant luminous intensity. A masking blade (not shown) in the illumination optical system 8 defines a rectangular illumination area corresponding to a chip size. The image of a pattern on the reticle 2 partially illuminated using the illumination area is projected on the substrate 4 with a resist applied thereon via the reduction projection lens system 1. The illumination optical system 8 and the components from the reduction projection lens system 1 to the base 7 constitute the exposure system in the present embodiment. The substrate chuck 5 is provided with a reference level 9. A measurement stage 22 is disposed on the base 7 or another base 7a. The measurement stage 22 is freely movable in six axes, including the direction indicated by the arrow 22a, as in the exposure stage 6, and is another substrate stage for exposure and measurement. The substrate chuck 5 and the substrate 4 are first placed on the measurement stage 22.

The first height detecting unit (10 to 19 and 130) is a unit for measuring the height position of each or any of the chips on the substrate 4 relative to the reference level 9 on the substrate chuck 5 while the substrate 4 and the substrate chuck 5 are placed on the measurement stage 22. The first height detecting unit stores data on the measurement in a memory 130. More accurately, the memory 130 is a memory in the processor 130 calculating the height for each measurement spot based on an output from the photoelectric conversion unit group 19. The reference level 9 on the substrate chuck 5 can be formed with the addition of, for example, a metal thin film or a metal plate thereto so as to be substantially flush with the substrate 4 to improve the accuracy of measurement. After that, the substrate 4 is moved from on the measurement stage 22 to the exposure stage 6 while being attracted to the substrate chuck 5 by means of, for example, a vacuum or static electricity. Then, a focusing operation is performed such that the substrate 4 is positioned on a predetermined plane. A second height position measurement device 100 performs a focusing operation corresponding to measurement of the height by using the reference level 9. For example, the second height position measurement device 100 performs a focusing operation by using the reference level 9 and a focus mark 23. The focus mark 23 is disposed within an exposable region (circuit pattern) on the reticle 2 or on the border line thereof. The focus mark 23 can be a pin hole, for example. Light from the illumination optical system 8 passes through the focus mark 23, and then the image is formed adjacent to the reference level 9 on the substrate chuck 5 by the reduction projection lens system 1. Light is reflected from the reference level 9, and then the image is formed again adjacent to the focus mark 23 by the reduction projection lens system 1. When the reticle 2 and the reference level 9 are completely focused, the quantity of light passing through the focus mark (pin hole) 23 is largest. A measurement device 26 measures this maximum light quantity using a half mirror 24 and a condenser 25 while driving a Z stage and inputs the result into a main controller 110. The main controller 110 controls the position of the stage (z direction) via a driver 120 so as to stop the exposure stage 6 at the location where the light quantity is the maximum value. The driver 120 moves the exposure stage 6 within an X-Y plane to sequentially move the chips on the surface of the substrate to an exposure position in accordance with various kinds of prior information specified by a console 140. Information on the position of the measurement stage 22 in the X and Y directions is always measured by a laser interference system 28 irradiating an XY bar mirror 27 with a plurality of laser beams. The information on the height position of each chip relative to the reference level 9 on the surface of the substrate chuck 5 stored in the memory 130 after the height position is measured on the measurement stage 22 is input into the main controller 110. The driver 120 drives the Z stage of the exposure stage 6 such that each chip is at a focus position in accordance with the information on the height position. Thereafter, the substrate is exposed. In measurement of the height position on the substrate 4 by use of the first height detecting unit, a measurement offset, which is the difference between a measurement value and an optimal focus set surface, is determined by use of a method described in Japanese Patent Laid-Open No. 9-045608.

An exposure method according to an embodiment of the present invention will now be described below. The exposure method is a method of emitting measurement light on the surface of a substrate, receiving reflected light from measurement light, and exposing the substrate using an exposure apparatus that includes a surface position measuring device that measures information on the height of the surface of the substrate. Information on the height of the surface of the substrate and information on the reflectivity of the surface of the substrate (information on the intensity of reflected light) are measured using the surface position measuring device. Then, a measurement spot less prone to being affected by errors resulting from reflectivity distribution is determined in the surface of the substrate. A change in reflectivity is calculated for each measurement spot region, and a measurement spot that has the smallest change in reflectivity is determined. The change in reflectivity is present between a measurement spot on a first pattern having a highest reflectivity and that on a second pattern having a lower reflectivity. Alternatively, the reflectivity is calculated at the same point in each of shot regions within the surface of the substrate, and a point that has the smallest reflectivity or a higher reflectivity is determined as the measurement spot less prone to be affected by errors. Alternatively, the reflectivity is calculated at the same point in each shot region within the surface of the substrate, and a point that has the smallest change in reflectivity among the shot regions is determined as the measurement spot less prone to be affected by errors. With reference to information on the height of the measurement spot less prone to being affected by errors determined by use of any one of the processes described above, an error component of information on the height of all measurement spots is measured, and a measured error component is corrected for each of the measurement spots.

By use of a measurement offset, which is the difference between a measurement value and an optimal focus set surface, a measurement value is corrected for each measurement spot. FIG. 3 illustrates shot regions 301 to 351 used to measure a measurement offset. FIG. 4 illustrates measurement spots in a shot region. Lattice points in shot regions illustrated in FIG. 4 correspond to measurement spots, such as 401 and 402, and the height position on the substrate 4 is measured at these points. The lattice points illustrated in FIG. 4 are 17 rows and 12 columns, and the total number of the lattice points is 204, for example. Therefore, the number of measurement spots (e.g., 401 or 402) within a shot region is 204.

In the present embodiment, a measurement offset, which is the difference between a measurement value and an optimal focus set surface, is calculated for each of all the measurement spots within each of the shot regions by use of processing illustrated in the flowchart of FIG. 9, based on results of measurement for measurement spots within the shot regions 301 to 351, and the measurement value is corrected using the measurement offset. In step 901, the main controller 110 starts control. In step 902, the main controller 110 controls a conveying hand (not shown) to load the substrate 4 onto the measurement stage 22 and controls the substrate chuck 5 to hold the substrate 4 by attraction. In step 903, the main controller 110 finds a measurement distance within a shot region and the amount of change in measurement timing between adjacent shot regions from information on the size of the substrate and layout as measurement position information, and stores the measurement position information. Examples of the information on the size of the substrate and layout can include various kinds of prior information specified by the consol 140, information on the size of the scan measurement region, and arrangement of shot regions, and the scanning speed. In step 904, the main controller 110 controls the first height detector 10 to 19 to measure the height position and the intensity of reflected light for each measurement spot in synchronization with a scan in each of the shot regions 301 to 351 on the measurement stage 22.

As indicated by the arrow 360 illustrated in FIG. 3, a plurality of shot regions aligned in the Y direction are subjected to measurement in one scan driving. After the stage is accelerated and reaches a constant speed in front of the shot region 361, the measurement spots in each of the shot regions 361 to 367 are sequentially subjected to measurement by scanning at a uniform speed. In the present embodiment, to enhance the measurement efficiency, the two adjacent shot regions aligned in the X direction are also simultaneously measured. When measurement in the shot region 367 is completed, the scan driving starts moving in the X direction to the next two columns while immediately reducing the speed. The scanning direction is inverted and the stage is accelerated. After a plurality of shot regions aligned in the Y direction are sequentially subjected to measurement by scanning with a uniform speed, when measurement in the shot region at the end is completed, the scan driving moves to the next two columns while reducing the speed. By repetition of these steps, the entire surface of the substrate is subjected to measurement. In such a way, because it is not necessary to accelerate or decelerate the stage for each shot region, the surface position measurement for the entire surface can be performed in a short time. In the present embodiment, the entire surface of the substrate is measured with a width of two shot regions. However, the width of measurement is not limited to two. The measurement may be performed with a width of one or more shot regions. The memory 130 stores information on the height position and the intensity of reflected light for the entire surface of the substrate. In step 905, a reflectivity determining unit 111 of the main controller 110 determines introduction of errors (makes assessment of the magnitude of errors) for each measurement spot from the intensity of reflected light of the surface of the substrate. The lattice points correspond to the measurement spots in a shot region. It is noted in FIG. 4, that there are a plurality of measurement spots around any measurement spot 401. A first method for determining introduction of errors using a change in reflectivity will be described below.

Figure 7A:
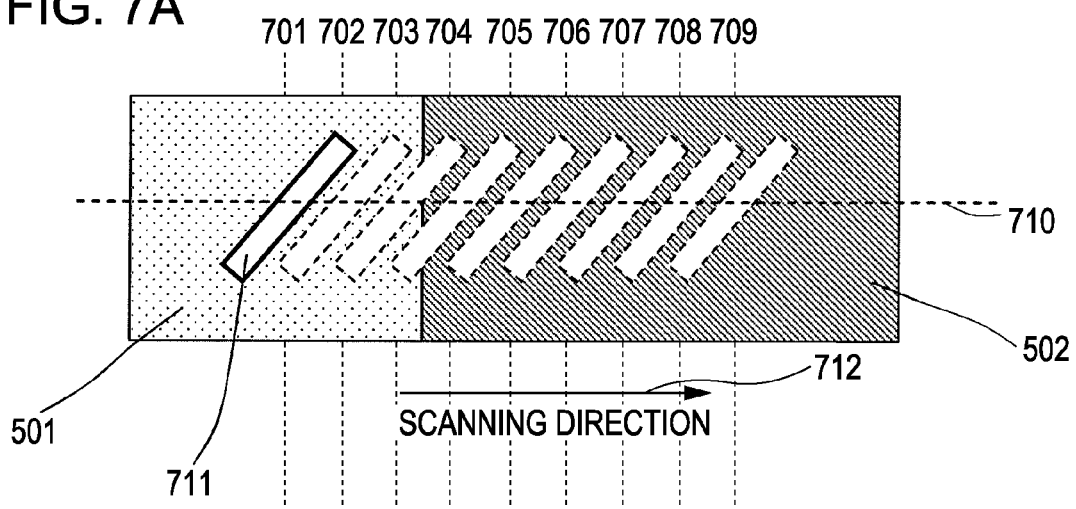
FIGS. 7A to 7C illustrate a relationship between a ground pattern and the amount of change in reflectivity in a measurement spot location.
Figure 7B:
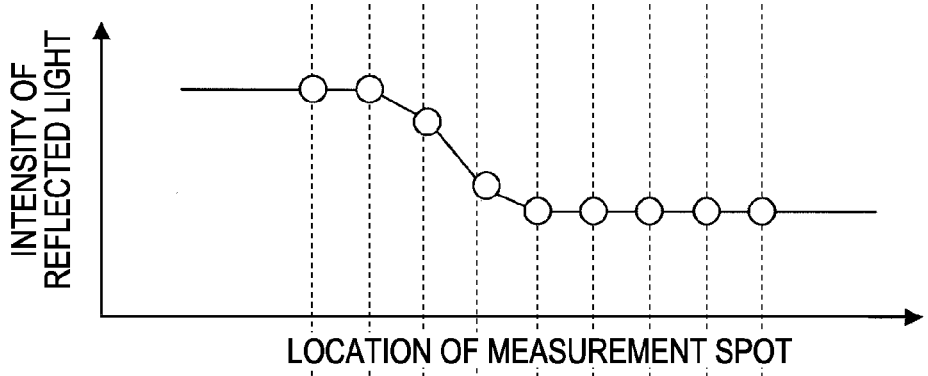
Figure 7C:
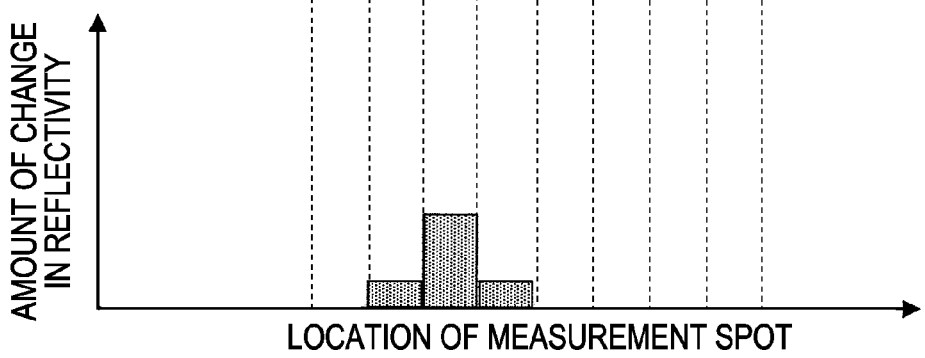

The first method is described using a state in which measurement spots 701 to 709 aligned in a line are arranged across an area that includes different intensities of reflected light with reference to FIGS. 7A to 7C. In FIG. 7A, a scan is performed in the direction indicated by the arrow 712, and the locations of measurement spots 701 to 709 are shown. A rectangular 711 represents the size of a measurement spot. The height position and the intensity of reflected light are measured in the order of the measurement spots 701 to 709. FIG. 7B is a schematic diagram that illustrates the intensity of reflected light for each measurement spot on the broken line 710 in FIG. 7A. The intensity of reflected light for each measurement spot varies in accordance with the arrangement of the patterns 501 and 502 within a measurement spot. FIG. 7C is a schematic diagram that illustrates the amount of change in reflectivity of adjacent measurement spots. A change in reflectivity is present between the measurement spot 702 on the pattern 501 having a higher reflectivity and the measurement spot 705 on the pattern 502 having a low reflectivity. That is, detecting the change in reflectivity allows the detection of the measurement spots 703 and 704 having inherent detection errors according to the arrangement of the patterns 501 and 502. In FIGS. 7A to 7C, the change in reflectivity is determined in the scanning direction. The same determination is made also in a nonscanning direction and an oblique direction from the intensities of reflected light for a plurality of measurement spots aligned in a line.

Figure 8A:
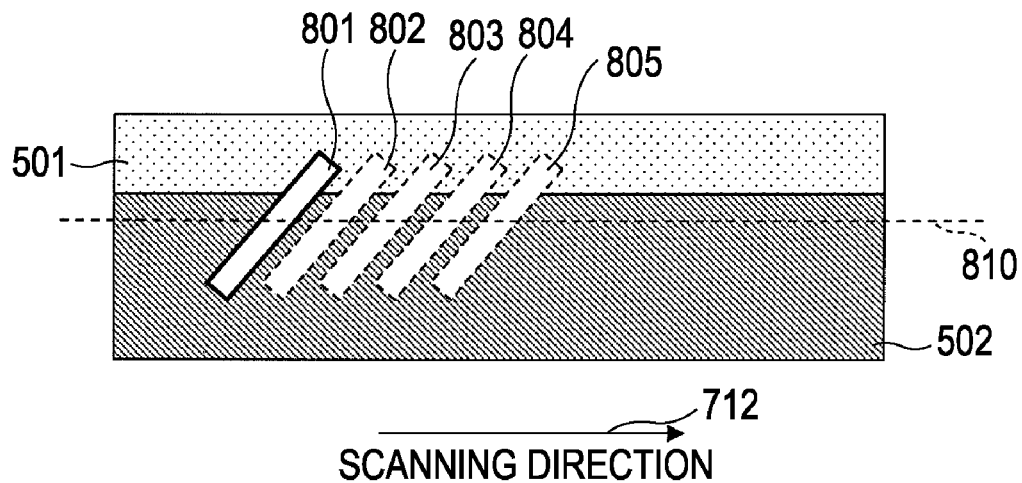
FIGS. 8A and 8B illustrate a relationship between the ground pattern and the direction used for determining the amount of change in reflectivity in a measurement spot location.
Figure 8B:
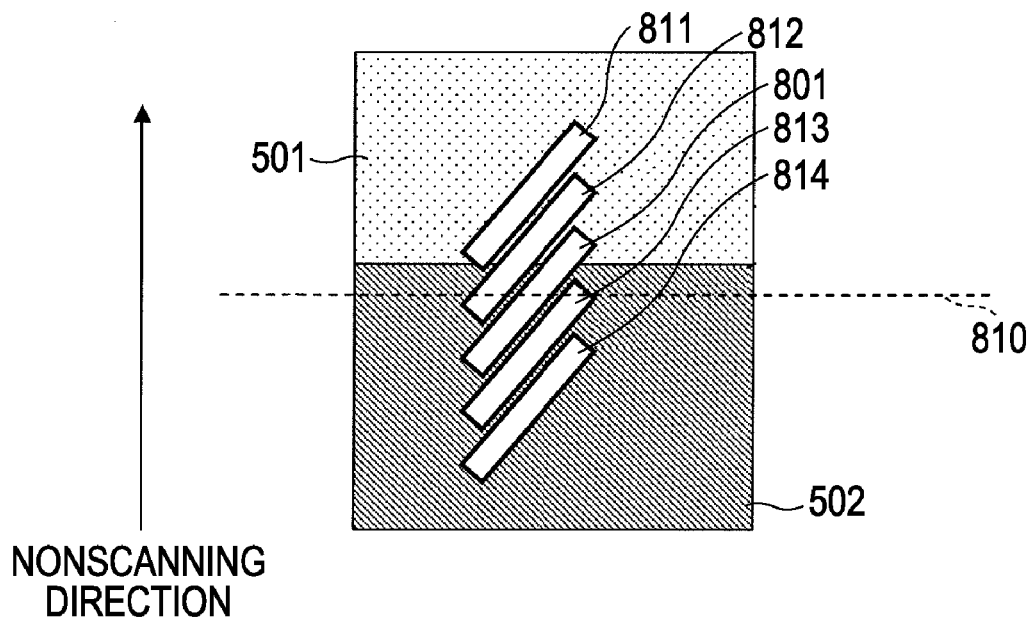

FIGS. 8A and 8B illustrate usefulness of detection of a change in reflectivity in a two-dimensional manner when the change in reflectivity in a measurement spot 801 is measured. As illustrated in FIG. 8A, in the measurement spots 801 to 805, the change in reflectivity may be measured smaller, depending on the direction of arrangement of the patterns 501 and 502 (when the intensity change is assessed on the broken line 810 in FIG. 8A). However, as illustrated in FIG. 8B, in combination with a change in the intensity of reflected distribution in the measurement spots 801 and 811 to 814 in a nonscanning direction, the change in reflectivity according to arrangement of the patterns 501 and 502 can be determined. The reliability is increased with an increase in the number of directions used to determine a change in reflectivity, for example, in two-dimensional detection. In such a way, a change in reflectivity between neighboring measurement spots, as illustrated in FIG. 4, is measured for each measurement spot region over the entire surface of the substrate.

A second method for making the determination using smallness of variations in reflectivity at the same point in shot regions will now be described below. For example, it has been known that non-uniformity of CMP to an interlayer dielectric and non-uniformity of an applied resist occur in the surface of a substrate. In each of measurement spots in each of shot regions, there is a measurement spot that is less prone to being affected by such non-uniformity of film pressure. A measurement spot that has a small variation in reflectivity in each shot region can be determined as a measurement spot that has small inherent detection errors according to the arrangement of the patterns 501 and 502.

A third method for making the determination using a measurement spot that has the highest or the lowest reflectivity at the same point in each shot region will now be described below. The measurement spot having the highest or the lowest reflectivity can be considered as a measurement spot that has a small variation in reflectivity in an area irradiated with beams. Therefore, is such a measurement spot, a change in the barycenter 601 of the intensity distribution caused by a relative positional relationship between the patterns 501 and 502 having different reflectivities and incident beams is estimated to be small. That is, such a measurement spot can be determined as a measurement spot at which detection errors inherent in a process in which pattern structures are different is less prone to occurring. In addition to the methods described above, a generally known method of excluding, for example, a result that exceeds a predetermined amount of threshold from a mean value as a void result can also be used. In the foregoing, a measurement spot that has the smallest amount of change in reflectivity is determined from a plurality of shot regions in the surface of the substrate. However, the present invention is not limited to this. Such a measurement spot can be determined from a plurality of substrates. In this case, without depending on an individual difference of a substrate, influence of errors resulting from reflectivity distribution in the surface of a substrate can be measured with high precision.

Referring back to FIG. 9, in step 906, a measurement spot that has the smallest errors (i.e., that is estimated to have the smallest errors) is determined based on at least one determination result. A plurality of measurement spots can be determined. In this case, measurement spots that satisfy a predetermined determination condition for estimating that errors are relatively small can be selected. In step 907, relative to information on the height of each measurement spot in a shot region determined by the reflectivity determining unit 111, a correction value for each of all measurement spots is calculated. The correction value used herein is a correction value for each measurement spot described in Japanese Patent Laid-Open No. 9-045608, which is mentioned above. That is, a global shape of the entire surface of the substrate or of the surface of a shot region, the global shape being free from influence of local asperities, is determined from a measurement value at each measurement spot in all shot regions or a plurality of sampled shot regions. The global shape can be determined by approximation of a measurement value at each measurement spot using a predetermined polynomial function relating to two-dimensional coordinates using the least squares method. The difference between a measurement value (height) and a corresponding value (height) obtained from the global shape is made to be a correction value for the measurement value for each measurement spot. A more appropriate correction value is calculated based on a measurement value at a highly reliable reference measurement spot determined in step 907. More specifically, a correction value is calculated by finding a highly reliable global shape by, for example, increasing a weight for measurement values at only one or more reference measurement spots. Here, the global shape may be determined based on only measurement value at one or more reference measurement spots (i.e., by making a weight for measurement values at the other measurement spots zero). A method for calculating a correction value is not limited to the above-described method. Any method is applicable as long as it can suppress (reduce) influence of variations in a measurement value at a measurement spot that has a poor reliability on a correction value for a highly reliable measurement spot by increasing a weight for a measurement value at one or more reference measurement spots. A surface position determining unit 112 illustrated in FIG. 1 corrects the height measured by the first height detecting unit for each measurement spot with the above correction value. In addition, the height and inclination (and a correction amount therefor) in a corresponding surface area of the substrate within each shot region are calculated based on a corrected height of each of a plurality of measurement spots subjected to simultaneous measurement. In step 908, the amount of driving for correction of the surface position in a shot region calculated in step 907 and positional information on an effective measurement point are stored in the main controller 110. In step 909, the substrate is moved to the exposure stage while being attracted to the substrate chuck. In step 910, a focus driving is performed using a mark for focusing a reticle and the reference level on the substrate chuck. Then, in step 911, information on the height from the reference level on the substrate chuck is corrected using the correction value, the amount of correction to an image-plane position is calculated, and a shot exposure region is exposed while being corrected to the image plane. In step 912, it is determined whether exposure has been completed for all shot regions on the substrate. If it has not been completed, flow returns to step 911, where a shot exposure region is exposed while being corrected to the image plane. Exposure is repeated for each shot region in an alternating manner. If all shot regions have been exposed, the substrate is unloaded from the exposure stage in step 913, and an exposure sequence ends in step 914. In the present embodiment, as illustrated in FIG. 1, the exposure apparatus includes different measurement stage and exposure stage. However, if a so-called off-line system is established, a plurality of scanning exposure apparatuses or a combination of one measurement stage and a plurality of exposure stages are also applicable.

Figure 10:
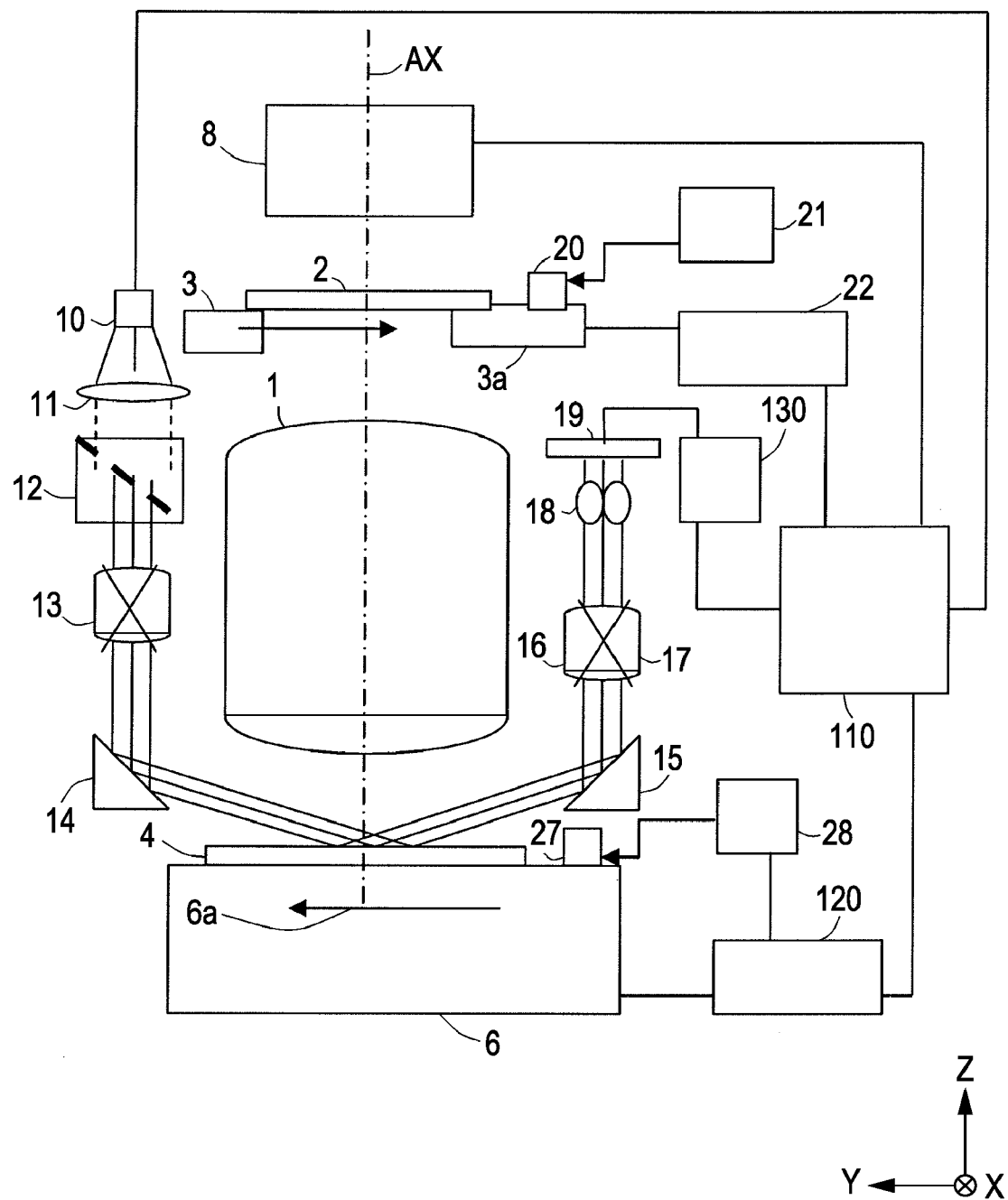
FIG. 10 is a partial schematic diagram that illustrates another example of a slit-scan projection exposure apparatus that uses a surface position detecting method according to an embodiment of the present invention.
Figure 13A:
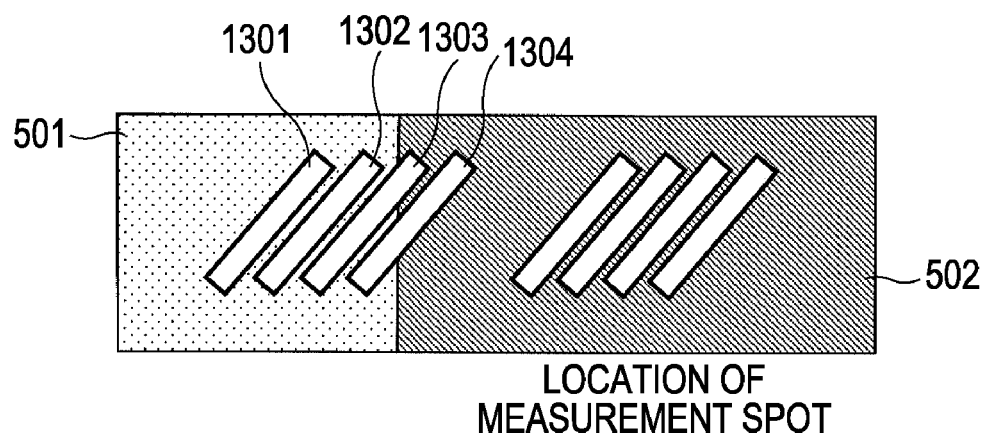
FIGS. 13A and 13B illustrate a relationship between a ground pattern and the amount of change in reflectivity in a measurement spot location.
Figure 13B:
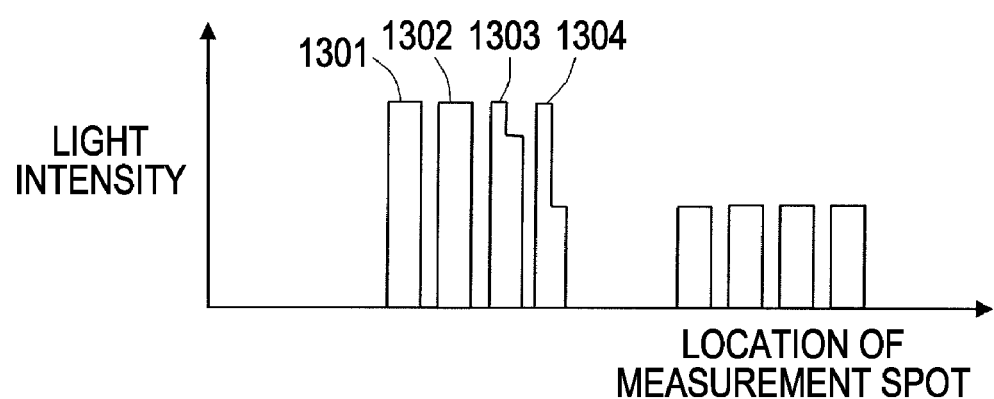

A single-stage scanning exposure apparatus, as illustrated in FIG. 10, is also applicable. In FIG. 9, steps 901 to 914 are described as a series of processing. As is obvious from the existence of different measurement stage and exposure stage, the following processing may be performed. In parallel with scanning exposure from step 909, the next substrate can be loaded to the measurement stage and being subjected to steps 901 to 908. In this case, because substrates can be processed continuously without waste, the substrates can be exposed with high efficiency. In FIGS. 7 and 8, one measurement spot is indicated by one rectangle. However, as illustrated in FIG. 13A, one measurement spot can be subjected to measurement using a plurality of marks 1301 to 1304. In this case, as illustrated in FIG. 13B, a change in ground reflectivity can be grasped more finely by processing the light intensity. Thus, an advantage of being less prone to being affected by errors is obtainable.

A method of manufacturing a device by use of the above-described exposure apparatus will now be described. The device (e.g., a semiconductor integrated circuit device or a LCD device) is manufactured through an exposure step of exposing a substrate with a photoresist applied thereon (e.g., a wafer or a glass plate) to light using an exposure apparatus according to any one of the foregoing embodiments, a development step of developing the exposed substrate, and another known step.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-178567 filed Jul. 6, 2007, which is hereby incorporated by reference herein in its entirety.

What is claimed is:

1. An exposure apparatus for exposing a shot region on a substrate to light, the apparatus comprising:
   a stage configured to hold the substrate and to be movable;
   a projection optical system configured to project light onto the substrate;
   a measuring device configured to measure a position of a partial region of a surface of the substrate with respect to a direction of an optical axis of the projection optical system; and
   a controller configured to cause the measuring device to measure the position with respect to each of a plurality of measurement points of each of a plurality of shot regions, to determine a global shape of the surface based on the measured positions, to calculate a correction value with respect to each of the plurality of measurement points based on a difference between the measured position and a corresponding position obtained from the determined global shape, and to move the stage based on measurement values corrected using the respective correction values corresponding to the respective measurement points,
   wherein the controller is configured to select at least one of the plurality of measurement points where a reproducibility of measured positions satisfies a predetermined condition, and to calculate the global shape with a weight for a measured position of the selected measurement point greater than weights for measured positions of measurement points other than the selected measurement point.

2. An apparatus according to claim 1, wherein the measuring device is configured to project light obliquely onto the surface, to detect light reflected from the surface, and to measure the position of the partial region based on a barycenter of the detected light.

3. A method of manufacturing a device utilizing an exposure apparatus for exposing a shot region on a substrate, the exposure apparatus including a stage configured to hold the substrate and to be movable; a projection optical system configured to project light onto the substrate; a measuring device configured to measure a position of a partial region of a surface of the substrate with respect to a direction of an optical axis of the projection optical system; and a controller configured to cause the measuring device to measure the position with respect to each of a plurality of measurement points of each of a plurality of shot regions, to determine a global shape of the surface based on the measured positions, to calculate a correction value with respect to each of the plurality of measurement points based on a difference between the measured position and a corresponding position obtained from the determined global shape, and to move the stage based on measurement values corrected using the respective correction values corresponding to the respective measurement points, wherein the controller is configured to select at least one of the plurality of measurement points where a reproducibility of measured positions satisfies a predetermined condition, and to calculate the global shape with a weight for a measured position of the selected measurement point greater than weights for measured positions of measurement points other than the selected measurement point; the method comprising:
   exposing a substrate to light using the exposure apparatus;
   developing the exposed substrate; and
   processing the developed substrate to manufacture the device.

4. An apparatus according to claim 1, wherein whether the reproducibility satisfies the predetermined condition is determined using smallness of a variation in measured positions.

5. A method according to claim 3, wherein whether the reproducibility satisfies the predetermined condition is determined using smallness of a variation in measured positions.

* * * * *